(12) United States Patent
Biese et al.

(10) Patent No.: US 7,601,549 B2
(45) Date of Patent: Oct. 13, 2009

(54) METHOD OF PROCESSING SEMICONDUCTOR WAFERS

(75) Inventors: Gernot Biese, Marzling (DE); Ulrich Clement, Puchheim (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/107,188

(22) Filed: Apr. 22, 2008

(65) Prior Publication Data

US 2008/0261334 A1 Oct. 23, 2008

Related U.S. Application Data

(60) Provisional application No. 61/016,662, filed on Dec. 26, 2007.

(30) Foreign Application Priority Data

Apr. 23, 2007 (DE) .................. 10 2007 019 122

(51) Int. Cl.
 *H01L 21/66* (2006.01)
(52) U.S. Cl. .................. 438/7; 438/14; 257/E21.525
(58) Field of Classification Search .............. 438/5, 438/7, 14, 16, 18; 257/E21.525, E21.53
 See application file for complete search history.

(56) References Cited

U.S. PATENT DOCUMENTS

| | | | |
|---|---|---|---|
| 5,462,012 A | | 10/1995 | Chiu |
| 6,284,622 B1 | | 9/2001 | Campbell et al. |
| 6,495,381 B2 | * | 12/2002 | Song et al. .................. 438/22 |
| 7,033,843 B2 | * | 4/2006 | Hasegawa et al. .............. 438/11 |
| 7,525,843 B2 | * | 4/2009 | Sekar et al. ............. 365/185.18 |
| 2006/0046166 A1 | * | 3/2006 | Yang et al. .................... 430/30 |

FOREIGN PATENT DOCUMENTS

| | | |
|---|---|---|
| DE | 19702140 A1 | 7/1998 |
| DE | 10241147 A1 | 4/2003 |
| EP | 0859406 A2 | 8/1998 |
| EP | 1223608 A1 | 7/2002 |
| EP | 1734571 A1 | 12/2006 |
| JP | 2005056986 A | 1/2003 |

* cited by examiner

*Primary Examiner*—Tuan N. Quach
(74) *Attorney, Agent, or Firm*—Jacqueline J. Garner; Wade J. Brady, III; Frederick J. Telecky, Jr.

(57) ABSTRACT

A method of processing semiconductor wafers comprises forming a pattern of recesses in an exposed surface of each wafer in a lot, prior to an epitaxy step. At least one recessed test structure is included in the pattern of recesses. At least one dimension of the recessed test structure is determined prior to the epitaxy step, then a corresponding dimension of an epitaxial structure grown above the recessed test structure in the epitaxy step is measured. A deviation between the dimension of the recessed test structure and the dimension of the epitaxial structure is determined and, from the deviation, the process temperature at which the epitaxy step was performed is determined. In case the deviation exceeds a predetermined limit, the temperature in the process chamber is adjusted for a subsequent lot of wafers to be processed.

18 Claims, 4 Drawing Sheets

METHOD OF PROCESSING SEMICONDUCTOR WAFERS

FIELD OF THE INVENTION

The present invention generally relates to a method of processing semiconductor wafers. More particularly, the present invention relates to inline control of epitaxial growth by measurement of pattern distortion of an epitaxial structure.

BACKGROUND OF THE INVENTION

The control of epitaxial processes must be very strict. Using the wrong parameters for an epitaxial process can cause the vertical and horizontal dimensions of the resultant epitaxial structure being outside the specified range for that particular process. This leads to the scrapping of wafers and also to problems with alignment of the wafers in subsequent photolithography processes, which causes a mismatch in components formed on the wafers.

For example, epitaxial process temperature influences sheet resistance, alignment performance and DUF-shift, where DUF is the diffusion under film. The process temperature should therefore have a variance of no more than ±5° C. for any given epitaxial process.

However, the effective temperature of the epitaxial reactor cannot currently be measured inline during the epitaxial process. Therefore, if the temperature should fluctuate from that required for a particular process during the process itself, this would not be apparent until after the entire process has been completed. By this time, other lots of wafers would have been processed in the epitaxial reactor, adding to the wastage.

The present invention has been devised with the foregoing in mind.

SUMMARY OF THE INVENTION

Thus the present invention provides a method of processing semiconductor wafers, in which lots of wafers are processed in a sequence of processing steps. The sequence of processing steps includes at least one epitaxy step performed in the same processing chamber for all lots. Prior to the epitaxy step, a pattern of recesses is formed in an exposed surface of each wafer in a lot such that at least one recessed test structure is included in the pattern of recesses. At least one dimension of the recessed test structure is determined prior to the epitaxy step and a corresponding dimension of an epitaxial structure is grown above the recessed test structure in the epitaxy step. A deviation between the determined dimension of the recessed test structure and the measured dimension of the epitaxial structure is determined, and the process temperature at which the epitaxy step is performed is determined. In case the deviation exceeds a predetermined limit, the temperature in the process chamber is adjusted for a subsequent lot of wafers to be processed. Subsequent lots of wafers will be processed at the correct temperature and will not have to be scrapped, thus wastage is reduced.

The dimension of the recessed test structure can also be determined from a mask used to form the pattern of recesses, instead of actually measuring the dimension of the recessed structure itself. This dimension can be determined by either measuring the mask after the pattern of recesses has been formed or by "measuring" design data.

Preferably, measurement of the dimension of the epitaxial structure grown above the recessed test structure is performed on a number of wafers in a lot and an averaged dimension is then used for determining the deviation between the dimension of the test structure and the dimension of the epitaxial structure. The dimensions of the recessed test structure and the epitaxial structure can be taken in two mutually perpendicular directions.

The wafers can either be of silicon that has one crystal axis at an angle from a line perpendicular to the exposed wafer surface, or they can be of silicon that has one crystal axis perpendicular to the exposed wafer surface.

Preferably, the determination of the temperature at which the epitaxy step was formed is based on an empirically determined relationship between process temperature and structure distortion in the epitaxy step.

BRIEF DESCRIPTION OF THE DRAWINGS

Further advantages and characteristics ensue from the description below of a preferred embodiment, and from the accompanying drawings, in which.

DETAILED DESCRIPTION OF THE EMBODIMENTS

Figure 1:
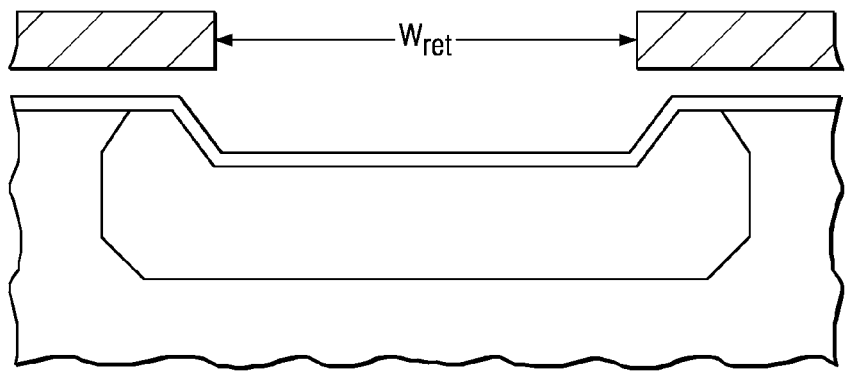
FIG. 1 is a schematic diagram of a masked silicon wafer for forming a test recess.
Figure 2:
FIG. 2 is a schematic diagram of a silicon substrate with the test recess formed in its surface.

In FIGS. 1 and 2, a small cross-section of a silicon wafer is shown schematically. The uppermost surface of the wafer shown in the figures represents an exposed and etched substrate surface after resist removal upon which epitaxial growth can take place. The wafer can either be made from silicon having one of the crystal axes (100 or 111) perpendicular to the exposed surface or from silicon having one of the crystal axes 4° off perpendicular to the exposed surface. Structures intended to become chips or dies for integrated circuit devices are grown epitaxially on most of the exposed wafer surface during an epitaxial process step. However, for evaluating epitaxial process conditions, test structures are also grown on an edge of the wafer surface.

FIG. 1 schematically illustrates a process step of forming a recess in the surface of a silicon substrate using a mask with a rectangular window of a width Wret. In the example illustrated, small rectangular areas of wafer surface are recessed. The size of the openings in the mask is such that the dimensions of the recessed areas of wafer are about 15.5×11.5 µm. However, the size of the mask openings can lie within a range from 1 to 40 µm, where the appropriate size correlates with the thickness of the epitaxial layer and the process conditions. It is important that the structure can be well resolved after epitaxial deposition. The surface of the wafer is etched using a conventional etching process. The result of the etching process is that a pattern of recesses is formed in the wafer surface, one of which being shown schematically in cross-section in FIG. 2. Each recess has the same dimensions as the opening in the mask, with respect to a plane comprising the exposed wafer surface.

In a first embodiment of the invention, the mutually perpendicular dimensions (in a plane with the exposed wafer surface) of the rectangular opening in the mask used in formation of the test recess are then measured. These dimensions are $Wret_y$ and $Wret_x$, respectively. In this case $Wret_y$ is 15.48 µm and $Wret_x$ is 11.475 µm. The wafer is then placed in an epitaxial growth chamber. This wafer is just one of a number of wafers in a lot upon which epitaxial structures are to be grown. In general, wafers are processed in lots of about 25. An epitaxial silicon structure is grown above the test recesses at the same time as die structures are epitaxially grown on the wafer under atmospheric pressure. The wafer is then taken out of the epitaxial chamber and the dimensions of the epitaxial structure grown above the test recess are measured, corresponding to the dimensions of the mask opening, $Wret_y$ and $Wret_x$, measured before the epitaxy step. The dimensions of the epitaxial structure are Wy and Wx, respectively. Wy and Wx are measured by optical linewidth measurement of the epitaxial structure using a microscope. The measurements of the dimensions Wy and Wx are then subtracted from the corresponding measured dimensions of the mask opening $Wret_y$ and $Wret_x$, respectively. The difference, or deviation, between a dimension of the mask opening and a corresponding dimension of the epitaxial structure is then $Wret_y-Wy$ or $Wret_x-Wx$.

FIGS. 3-7 show epitaxial structures grown above test recesses provided on a 0° wafer; that is, a silicon wafer having one of the crystal axes perpendicular to the exposed wafer surface. The structures in each figure are grown under different epitaxial processing conditions and are shown on the right hand side of each figure. The mask opening used for producing the test recesses is shown schematically on the left hand side of each figure.

Figure 3:
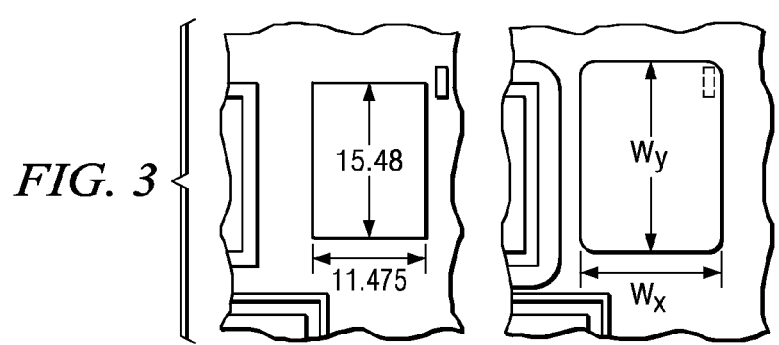
FIG. 3 is a diagram of an epitaxial structure formed in a test recess on a 0° silicon wafer that has been grown at a temperature of 1110° C. at a rate of 1.5 μm per minute and a pressure of about 100 hPa.
Figure 4:
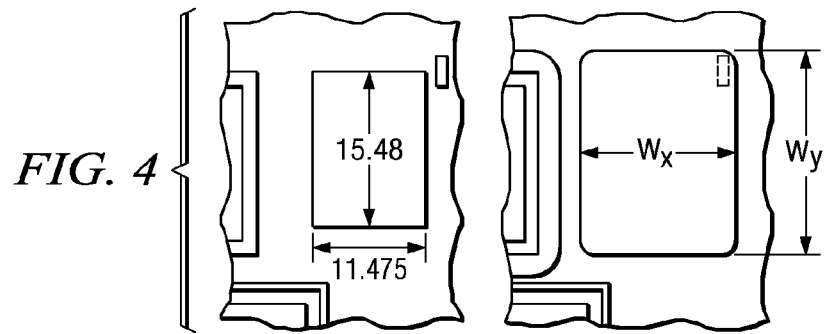
FIG. 4 is a diagram of an epitaxial structure formed in a test recess on a 0° silicon wafer that has been grown at a temperature of 1150° C. and a rate of 3 μm per minute and with atmospheric (ambient) pressure.
Figure 5:
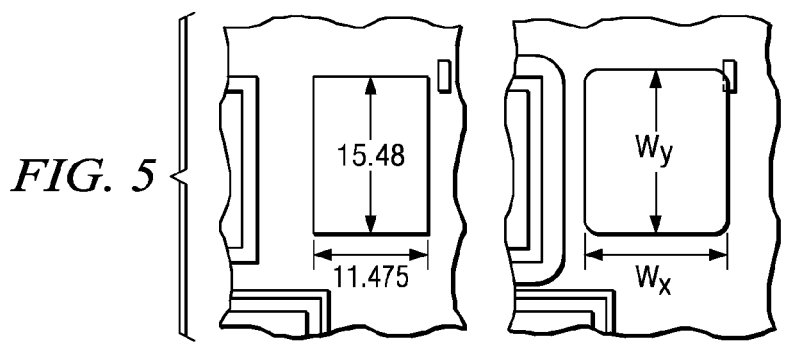
FIG. 5 is a diagram of an epitaxial structure formed in a test recess on a 0° silicon wafer that has been grown at a temperature of 1130° C. and a rate of 3 μm per minute and with atmospheric (ambient) pressure.

FIG. 3 shows an epitaxial structure formed in a test recess on a 0° silicon wafer that has been grown at a temperature of 1110° C. at a rate of 1.5 µm per minute and a pressure of about 100 hPa, in which the dimensions Wy and Wx are within the specified range for that process. FIGS. 4 and 5 show epitaxial structures grown at a growth rate of 3 µm per minute, with the structure in FIG. 4 having been grown in an epitaxial chamber with a process temperature of 1150° C. and the structure in FIG. 5 in an epitaxial chamber with a process temperature of 1130° C. The dimensions Wy and Wx of the epitaxial structures are measured. It is found, as can be seen from FIGS. 4 and 5, that the dimensions Wy and Wx of the epitaxial structures are smaller than the corresponding dimensions of the mask opening $Wret_y$ and $Wret_x$. In other words, the epitaxial structure has shrunk with respect to the test recess. The structure grown at the lower temperature of 1130° C. shown in FIG. 5 has shrunk by a greater amount in both the Wy and Wx directions, with respect to the mask opening, than the structure shown in FIG. 4 grown at the higher temperature of 1150° C.

Figure 6:
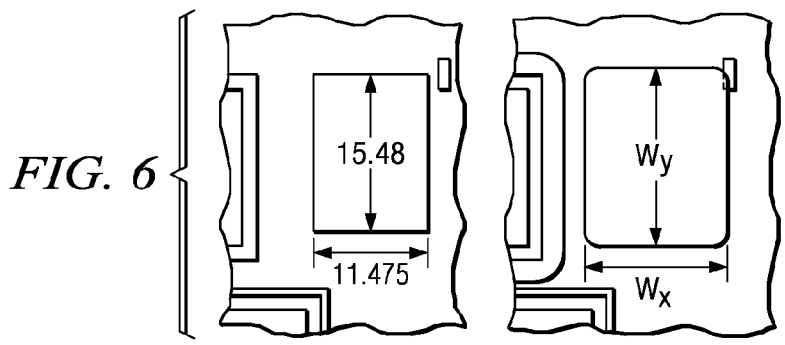
FIG. 6 is a diagram of an epitaxial structure formed in a test recess on a 0° silicon wafer that has been grown at a temperature of 1150° C. and a rate of 2 μm per minute and with atmospheric (ambient) pressure.
Figure 7:
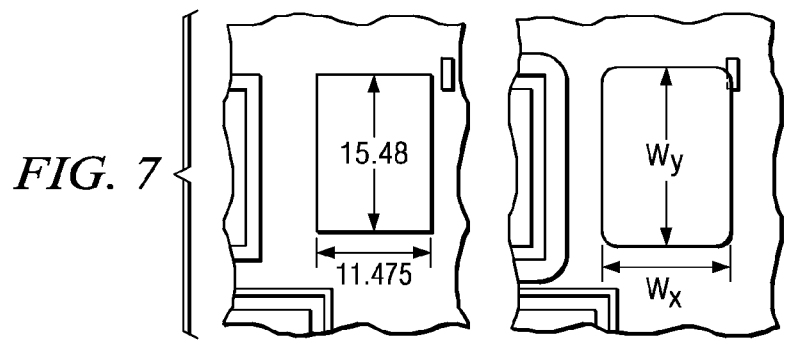
FIG. 7 is diagram of an epitaxial structure formed in a test recess on a 0° silicon wafer that has been grown at a temperature of 1130° C. and a rate of 2 μm per minute and with atmospheric (ambient) pressure.

FIGS. 6 and 7 show epitaxial structures grown at a growth rate of 2 µm per minute, with the structure in FIG. 6 having been grown at 1150° C. and the structure in FIG. 7 at 1130° C. The dimensions Wy and Wx are measured for both structures. As with the structures shown in FIGS. 4 and 5, it is found that the dimensions Wy and Wx of the epitaxial structures are less than the corresponding dimensions of the mask opening $Wret_y$ and $Wret_x$. Again the structure grown at 1130° C. has shrunk by a greater amount in both the Wy and Wx directions than the structure grown at 1150° C. However, the structures grown at a slower rate of 2 µm per minute shown in FIGS. 6 and 7 do not shrink in the Wy and Wx dimensions by as much as the structures grown at the faster rate of 3 µm per minute shown in FIGS. 4 and 5. Therefore the amount of distortion or shrinkage of the epitaxial structure relative to the mask opening is related to the temperature setpoint of the epitaxial chamber, as well as to the epitaxial growth rate. However, it has been found that the epitaxial growth rate is a much weaker factor in pattern distortion than the process temperature.

FIGS. 8-12 show epitaxial structures grown in a test recess on a 4° wafer; that is on a wafer with one of the crystal axes 4° off perpendicular to the exposed wafer surface. In such 4° wafers there is a further problem, in addition to pattern distortion or shrinkage, that epitaxial growth follows the crystal axis arranged 4° from perpendicular to the wafer surface. This means that the epitaxial structure gets shifted with respect to the exposed surface of the wafer in the direction followed by this crystal axis, which results in a misalignment of the epitaxial structure with respect to the recess upon which it is grown. This causes a mismatch in the epitaxial structures which must be addressed by appropriate stepper compensation.

In each of FIGS. 8-12, the epitaxial structures grown under different process conditions are shown on the right hand side of the figures and schematic diagrams of the mask used for forming the recessed patterns for the test recesses are shown on the left of the figures. As above, the mask used for each test recess has a first dimension of $Wy_{ret}$=15.48 µm and a second dimension of $Wx_{ret}$=11.475 µm. The corresponding dimensions of the epitaxial structure Wy and Wx are measured after the epitaxy step for each of the structures shown in FIGS. 8-12.

Figure 8:
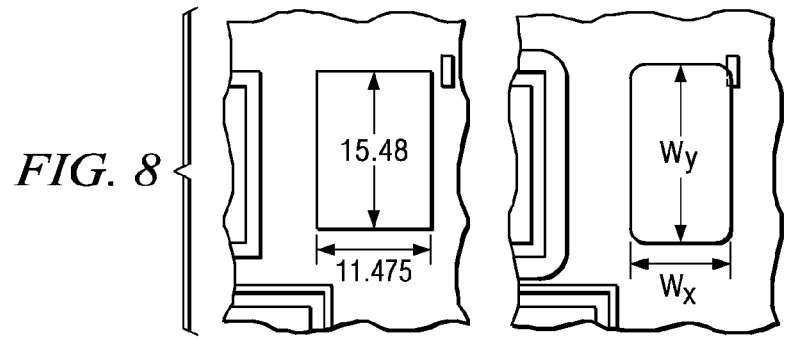
FIG. 8 is a diagram of an epitaxial structure formed in a test recess on a 4° silicon wafer that has been grown at a temperature of 1110° C., a rate of 1.5 μm per minute and a pressure of about 100 hPa.
Figure 9:
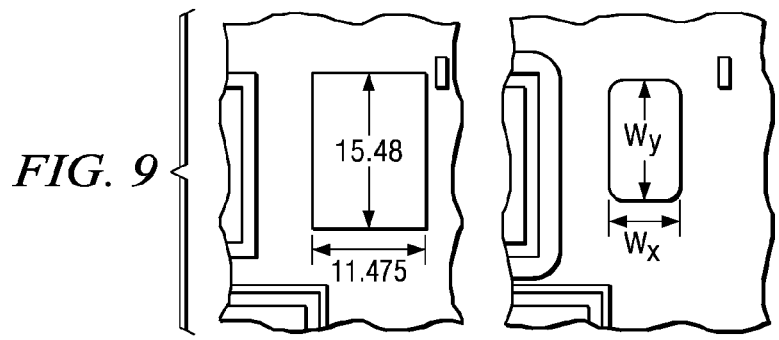
FIG. 9 is a diagram of an epitaxial structure formed in a test recess on a 4° silicon wafer that has been grown at a temperature of 1150° C. and a rate of 3 μm per minute and with atmospheric (ambient) pressure.
Figure 10:
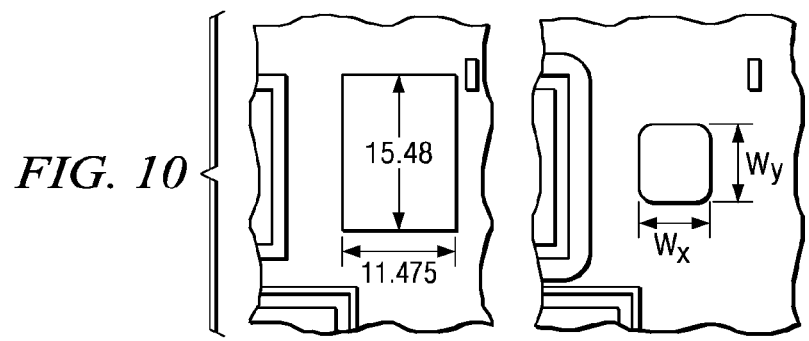
FIG. 10 is a diagram of an epitaxial structure formed in a test recess on a 4° silicon wafer that has been grown at a temperature of 1130° C. and a rate of 3 μm per minute and with atmospheric (ambient) pressure.
Figure 11:
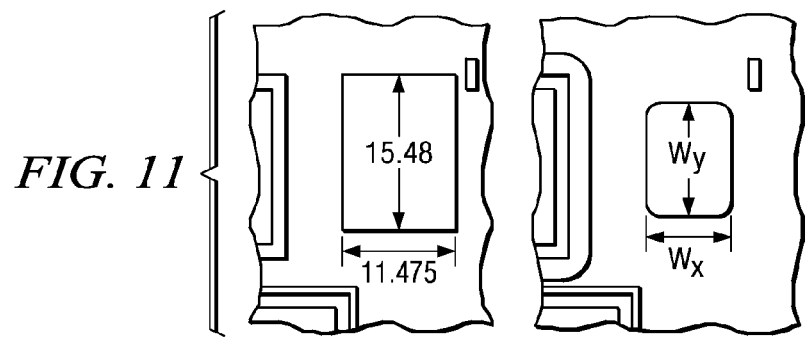
FIG. 11 is a diagram of an epitaxial structure formed in a test recess on a 4° silicon wafer that has been grown at a temperature of 1150° C. and a rate of 2 μm per minute and with atmospheric (ambient) pressure.
Figure 12:
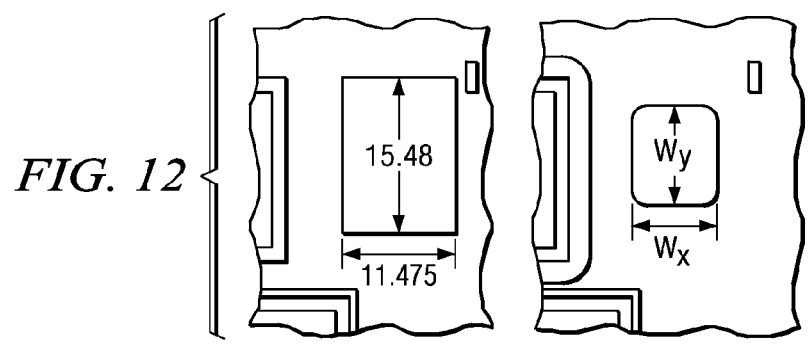
FIG. 12 is diagram of an epitaxial structure formed in a test recess on a 4° silicon wafer that has been grown at a temperature of 1130° C. and a rate of 2 μm per minute and with atmospheric (ambient) pressure.

FIG. 8 shows a structure in which the epitaxial structure was grown under conditions such that Wy and Wx are within the specified range required for that process. FIGS. 9 and 10 show epitaxial structures grown in a test recess at a growth rate of 3 µm per minute, with the structure in FIG. 9 having been grown at a process temperature of 1150° C. and the structure in FIG. 10 having been grown at a process temperature of 1130° C. FIGS. 11 and 12 show epitaxial structures grown in a test recess at a rate of 2 microns per minute, with the structure shown in FIG. 11 having been grown at a process temperature of 1150° C. and in FIG. 12 at a process temperature of 1130° C.

The dimensions Wy and Wx of the epitaxial structures are measured for the structures shown in FIGS. 9-11 by using a microscope to determine the optical linewidths of the epitaxial structures in the mutually perpendicular directions. The obtained values of Wy and Wx are then subtracted from the corresponding dimensions of the mask $Wret_y$ and $Wret_x$ to obtain the deviations of the dimensions of the epitaxial structure from the corresponding dimensions of the mask, $Wret_y$-Wy or $Wret_x$-Wx. The values of $Wret_y$-Wy and $Wret_x$-Wx are lowest for the epitaxial structure grown at the higher temperature of 1150° C. and the slower growth rate of 2 μm/minute shown in FIG. 11.

The dimensions Wy and Wx of the epitaxial structures grown in test recesses on both the 0° and the 4° wafers are measured for a number of the wafers in the lot that have been processed in the epitaxy chamber. One lot usually comprises 25 wafers.

Figure 13:
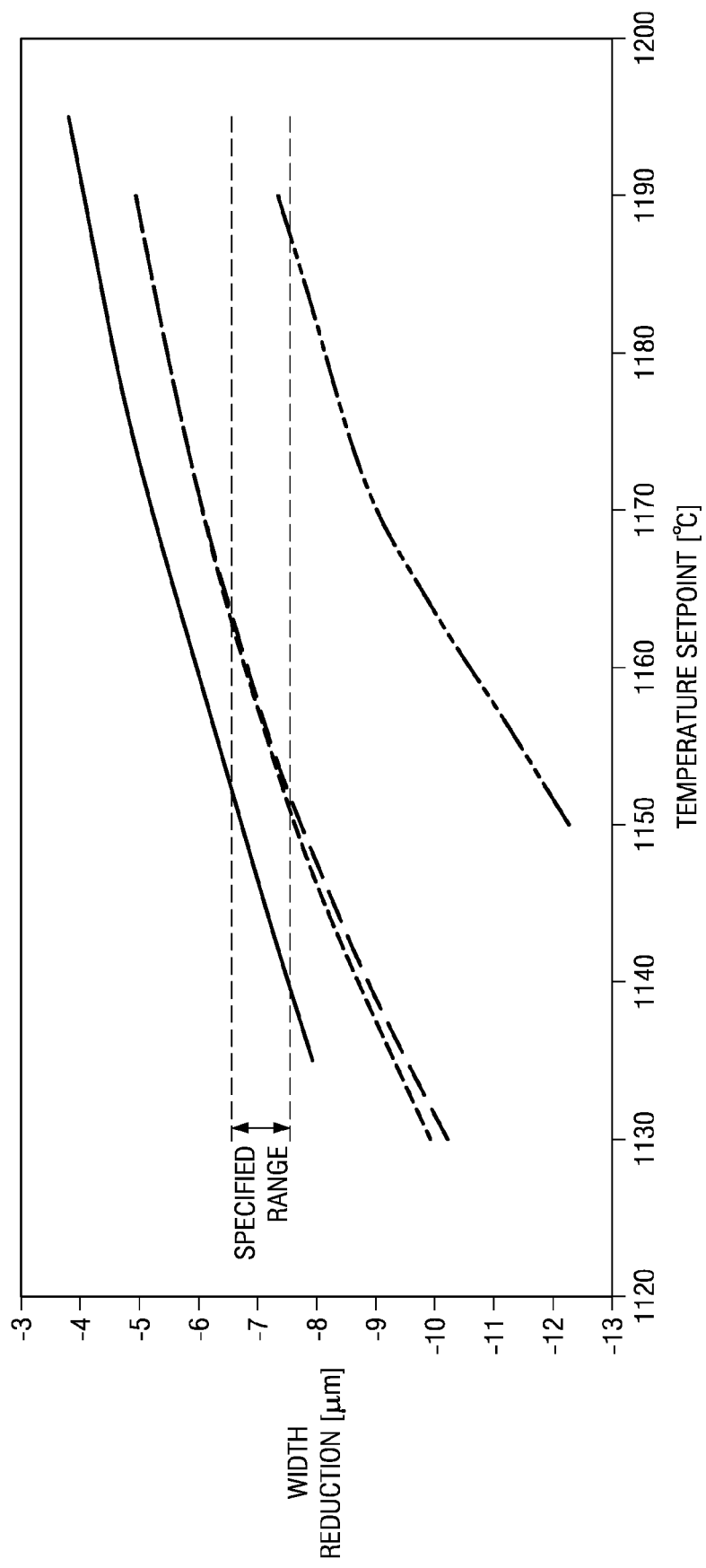
FIG. 13 is a graph of width reduction of the epitaxial structure versus temperature of the epitaxial set point for 4° wafers.

In order to empirically determine the relationship between shrinkage and process temperature, tests are conducted over a range of temperatures, from 1120° C. to 1200° C. The obtained dimensions Wy and Wx are then averaged for each temperature over the number of wafers from which measurements have been taken. In actual fact, it is not necessary to measure both dimensions Wy and Wx. In this case only the values for Wy are subtracted from the corresponding dimension of the mask opening $Wret_y$ to obtain values of $Wret_y$-Wy for each temperature. It is also possible to calculate the average of $Wret_y$-Wy and $Wret_x$-Wx and $Wret_x$-Wx only, so that measurement of the dimension Wx and corresponding dimension $Wret_x$ is optional. The values of $Wret_y$-Wy are then plotted against temperature and the resultant graph is shown in FIG. 13. Only curves for 4° wafers are shown and in this example $Wret_y$ is 20 μm. The four curves reflect the performance of different epitaxial chambers. The lowest curve shows the performance of a specific chamber before a quartz change and the upper curve shows the performance of the same chamber just after a quartz change.

It can be seen from the graph in FIG. 13 that there is a relationship between the deviations of the dimension of the epitaxial structure from the dimension of the mask $Wret_y$-Wy and the process temperature set point of the processing chamber in which the epitaxial structure was grown. The width reduction $Wret_y$-Wy is inversely dependent on temperature. The specified range of values of width reduction lie between the black horizontal lines shown on the graph. Therefore, it the deviation $Wret_y$-Wy (or $Wret_x$-Wx) exceeds the predetermined limit (between −6.5 and −7.5 μm) this indicates that the temperature has deviated from the process temperature setpoint. As can be seen from FIG. 13, the process temperature can be directly correlated with the deviation $Wret_y$-Wy. When the value of the deviation between the dimension of the epitaxial structure and the dimension of the mask is determined for a particular lot of wafers, the actual temperature at which the epitaxial process step took place can be determined from the relationship plotted in FIG. 13. Thus, when the value of $Wret_y$-Wy is outside the specified range, the temperature inside the epitaxial process chamber is adjusted to a value which brings the value of $Wret_y$-Wy inside a specified range for the subsequent lot of wafers to be processed. The lower curve demonstrates that the temperature setpoint in an aging epitaxial chamber can differ widely from the temperature actually intended for the epitaxial process.

In another embodiment of the invention, the actual dimensions of the recess itself are measured before the epitaxy step, instead of the dimensions of the mask opening. The silicon substrate wafer is masked, as shown in FIG. 1, with the areas of the wafer surface in which it is required to have a test recess being exposed. The wafer surface is then etched by conventional etching techniques to form a recess shown in FIG. 2. The mutually perpendicular dimensions $Wret_{y1}$ and $Wret_{x1}$ of each recess are then measured. The wafer is then placed in an epitaxial process chamber and an epitaxial structure is grown in each recess, as shown in FIGS. 4 to 7 for a 0° wafer and in FIGS. 9 to 12 for a 4° wafer. For each lot of wafers, the dimensions Wy and Wx are measured for a number of epitaxial test structures. The deviation between corresponding dimensions of the recess and the epitaxial structures, $Wret_{y1}$-Wy and $Wret_{x1}$-Wx, are then determined and averaged. As with the previous embodiment, it is found that the width reduction is outside the specified range, the temperature set point of the epitaxial chamber is adjusted for processing of a next lot of wafers to a temperature which will give a width reduction within the specified range for a particular process. It the variation of $Wret_{y1}$ and $Wret_{x1}$ is much smaller than the variation of Wy and Wx, the measurement of $Wret_{y1}$ and $Wret_{x1}$ can be omitted.

Therefore, the invention avoids the scrapping of wafers processed at the wrong temperature, the damage to which would only be discovered after completion of the entire process.

Although the present invention has been described with reference to specific embodiments, it is not limited to these embodiments and no doubt further alternatives will occur to the skilled person that lie within the scope of the invention as claimed.

The invention claimed is:

1. A method of processing semiconductor wafers wherein lots of wafers are processed in a sequence of processing steps that includes at least one epitaxy step performed in the same processing chamber for all of said lots, comprising the steps of:
    a) prior to said epitaxy step, forming a pattern of recesses in an exposed surface of each wafer in a lot;
    b) including at least one recessed test structure in the pattern of recesses;
    c) determining at least one dimension of the recessed test structure prior to said epitaxy step;
    d) measuring a corresponding dimension of an epitaxial structure grown above the recessed test structure in the epitaxy step;
    e) determining a deviation between the dimension determined in step c) and the dimension measured in step d);
    f) from the deviation determined in step e), determining the process temperature at which the epitaxy step was performed;
    g) in case the deviation determined in step f) exceeds a predetermined limit, adjusting the temperature in said processing chamber for a subsequent lot of wafers to be processed.

2. The method according to claim 1, wherein the dimension determined in step c) is determined from a mask used in step a).

3. The method according to claim 1, wherein the dimension determined in step c) is determined from by measurement after step a).

4. The method according to claim 1, wherein step d) is performed on a number of wafers in a lot and an averaged measured dimension is used in step e).

5. The method according to claim 1, wherein the dimensions in steps c) and d) are taken in two mutually perpendicular directions.

6. A method according to claim 1, wherein the wafers are of silicon that has one crystal axis at an angle from a line perpendicular to the exposed wafer surface.

7. A method according to claim 1, wherein the wafers are of silicon that has one crystal axis perpendicular to the exposed wafer surface.

8. The method according to claim 1, wherein the temperature determination in step f) is performed based on an empirically determined relationship between process temperature and structure distortion in the epitaxy step.

9. The method according to claim 1, wherein the dimension of the test structure is between 1 μm and 40 μm.

10. A method of fabricating integrated circuits wherein lots of wafers are processed in a sequence of processing steps, comprising the steps of:
   a) forming a pattern of recesses in an exposed surface of each wafer in a lot, wherein the pattern of recesses comprises at least one recessed test structure;
   b) determining at least one dimension of the recessed test structure;
   c) after determining the at least one dimension of the recessed test structure, forming an epitaxial structure on the recessed test structure;
   d) measuring a corresponding dimension of the epitaxial structure grown above the recessed test structure;
   e) determining a deviation between the dimension determined in step b) and the dimension measured in step d);
   f) from the deviation determined in step e), determining the process temperature at which the epitaxy step was performed;
   g) in case the deviation determined in step f) exceeds a predetermined limit, adjusting the temperature in said processing chamber for a subsequent lot of wafers to be processed.

11. The method according to claim 10, wherein the dimension determined in step b) is determined from a mask used in step a).

12. The method according to claim 10, wherein the dimension determined in step b) is determined from by measurement after step a).

13. The method according to claim 10, wherein step d) is performed on a number of wafers in a lot and an averaged measured dimension is used in step e).

14. The method according to claim 10, wherein the dimensions in steps b) and d) are taken in two mutually perpendicular directions.

15. A method according to claim 10, wherein the wafers are of silicon that has one crystal axis at an angle from a line perpendicular to the exposed wafer surface.

16. A method according to claim 10, wherein the wafers are of silicon that has one crystal axis perpendicular to the exposed wafer surface.

17. The method according to claim 10, wherein the temperature determination in step f) is performed based on an empirically determined relationship between process temperature and structure distortion in the epitaxy step.

18. The method according to claim 10, wherein the dimension of the test structure is between 1 μm and 40 μm.

* * * * *